United States Patent
Himmer

(10) Patent No.: US 9,698,331 B2
(45) Date of Patent: Jul. 4, 2017

(54) THERMOELECTRIC HEAT EXCHANGER

(71) Applicant: Behr GmbH & Co. KG, Stuttgart (DE)

(72) Inventor: Thomas Himmer, Reichenbach (DE)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 345 days.

(21) Appl. No.: 13/968,518

(22) Filed: Aug. 16, 2013

(65) Prior Publication Data
US 2014/0048112 A1 Feb. 20, 2014

(30) Foreign Application Priority Data

Aug. 17, 2012 (DE) .................. 10 2012 214 700

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
CPC .......................................... H01L 35/30–35/34
USPC ........................................ 136/205, 208, 209
See application file for complete search history.

(56) References Cited

U.S. PATENT DOCUMENTS

| | | | | |
|---|---|---|---|---|
| 2,650,112 A | * | 8/1953 | Kinkead | E04F 17/00 285/123.16 |
| 5,228,923 A | * | 7/1993 | Hed | H01L 35/32 136/203 |
| 6,083,770 A | * | 7/2000 | Sato | H01L 35/16 257/467 |
| 6,613,972 B2 | * | 9/2003 | Cohen | F28D 9/04 136/204 |
| 6,894,215 B2 | * | 5/2005 | Akiba | H01L 35/30 136/204 |
| 6,959,555 B2 | * | 11/2005 | Bell | F02G 1/043 62/259.2 |
| 7,143,788 B2 | * | 12/2006 | Keyes | F16L 51/025 138/118 |
| 2001/0013224 A1 | * | 8/2001 | Ohkubo | F25B 21/04 62/3.7 |
| 2003/0140957 A1 | | 7/2003 | Akiba | |
| 2010/0031987 A1 | * | 2/2010 | Bell | H01L 23/3735 136/200 |

(Continued)

FOREIGN PATENT DOCUMENTS

| | | |
|---|---|---|
| DE | 1 137 781 A | 10/1962 |
| DE | 10 2010 031 632 A1 | 1/2012 |

(Continued)

OTHER PUBLICATIONS

JP4669395, Machine Translation, Higashi, Apr. 2011.*
German Search Report, Application No. DE 10 2012 214 700.4, Dec. 10, 2012, 5 pgs.

*Primary Examiner* — Devina Pillay
(74) *Attorney, Agent, or Firm* — Paul D. Strain, Esq.; Strain & Strain PLLC

(57) ABSTRACT

The invention relates to a thermoelectric heat exchanger, comprising two pipes, wherein a first pipe encloses a second pipe. In a thermoelectric heat exchanger which has a high level of efficiency, a thermoelectric material unit is arranged between the first and second pipes, preferably without mechanical contact with said first and second pipes, and a first fluid flows around the first pipe from the outside, while a second fluid flows through the second pipe.

8 Claims, 12 Drawing Sheets

(56) References Cited

U.S. PATENT DOCUMENTS

2011/0067742 A1   3/2011   Bell et al.

FOREIGN PATENT DOCUMENTS

| EP | 2 333 829 A2 | 6/2011 | | |
|---|---|---|---|---|
| JP | WO2005/001946 A1 * | 1/2005 | ............. | H01L 35/32 |
| JP | 4669395 B2 * | 4/2011 | ............. | H01L 35/32 |
| WO | WO 2008/123330 A1 | 10/2008 | | |

* cited by examiner

THERMOELECTRIC HEAT EXCHANGER

CROSS-REFERENCE TO RELATED PATENT APPLICATIONS

This application is based upon and claims the benefit of priority from prior German Patent Application No. 10 2012 214 700.4, filed Aug. 17, 2012, the entire contents of which are incorporated herein by reference in their entirety.

TECHNICAL FIELD

The invention relates to a thermoelectric heat exchanger.

PRIOR ART

The energy from a motor vehicle which is stored in the form of heat in exhaust gas is discharged into the surroundings without being used. In order to increase the efficiency of the vehicle and therefore lower the emissions of $CO_2$ during operation of the motor vehicle, implementation of a thermoelectric generator in motor vehicles is considered. This thermoelectric generator converts part of the heat contained in the exhaust gas into electrical energy, wherein this electrical energy is fed to the motor vehicle. The thermoelectric generator can be arranged with different benefits at any desired location in the exhaust strand or in the exhaust gas recirculation system. However, thermoelectric materials which are known per se and which are used today are, owing to their configuration and connection technology, not best suited for use in a thermoelectric generator and also lack effectiveness in terms of their efficiency.

SUMMARY OF THE INVENTION, OBJECT, SOLUTION, ADVANTAGES

The object of the invention is to provide a thermoelectric heat exchanger which has a high level of efficiency and can be used in a structurally simple way in a thermoelectric generator.

This is achieved with the features of claim 1, by means of a thermoelectric heat exchanger comprising two pipes, wherein a first pipe encloses a second pipe, and a thermoelectric material unit which is arranged between the first and second pipes, wherein a first fluid flows around the first pipe from the outside, while a second fluid flows through the second pipe, and wherein the thermoelectric material unit is attached to a conductor profile which connects the first and second pipes mechanically to one another via the thermoelectric material unit.

This has the advantage that a thermoelectric material unit can be easily integrated into the heat exchanger. Furthermore, there is a high level of efficiency owing to a relatively low thermal resistance between the thermoelectric active materials and heat sources/heat sinks. This results in a structurally simple thermoelectric heat exchanger which can be used in a thermoelectric generator without a large degree of expenditure. Such a heat exchanger produces an electric current in which heat is converted into electric energy. The heat is transmitted to the thermoelectric material unit here by the two fluids. Such thermoelectric heat exchangers can, however, also be installed in thermoelectric heaters or coolers, where the flow through them is in contrast to that of a thermoelectric generator, and where they convert electrical energy into heat and as a result convey heat from one medium into the other.

The thermoelectric material unit is advantageously attached to a conductor profile which connects the first and the second pipes mechanically to one another via the thermoelectrical material unit. As a result of this connection of the thermoelectric material unit, the thermal resistances between the fluid and the thermoelectric material unit are minimized. Furthermore, by means of the conductor profile which is preferably embodied in the manner of a bridge, such a thermoelectric heat exchanger is capable of absorbing thermomechanical stresses and reducing heat losses. Thermoelectrics can be suitably integrated into such a heat exchanger.

In one refinement, the conductor profile is embodied in two parts, wherein a first part of the conductor profile is positioned on the second pipe, while a second part of the conductor profile is attached to the first pipe, and the first and second parts of the conductor profile are connected to one another via the thermoelectric material unit. On the one hand, this floating arrangement of the thermoelectric material unit produces a reliable electrical connection, and on the other hand thermomechanical stresses are compensated by the positioning of the thermoelectric material unit exclusively on the conductor profile.

In one variant, the conductor profile is composed of a multiplicity of elements which engage in a pipe gap between the first and second pipes, wherein the free ends of the first elements of the first part of the conductor profile and the free ends of the second elements of the second part of the conductor profile are oriented with respect to one another in such a way that at least two elements, which project towards one another and are preferably embodied similarly to an L or T, of the first part and of the second part of the conductor profile support the thermoelectric material unit. The engagement of the first element to the first part, and of the second element to the second part, of the conductor profile in one another and the simultaneous support of the thermoelectric material unit makes possible a very compact embodiment of the thermoelectric heat exchanger, which can be installed in a space-saving fashion in a thermoelectric generator, for example.

In one embodiment, the gap between the first and second pipes is filled with a filler material. The thermally insulating properties of the filler material permit good thermal insulation of the thermoelectric heat exchanger with respect to the surroundings and of the first and second pipes with respect to one another.

In one embodiment, the first and/or second elements of the conductor profile have at least one expansion joint. The expansion joint has the advantage that the thermoelectric stresses are compensated by these expansion joints.

The faces of the first and second pipes which support the first and/or second parts of the conductor profile advantageously have electrical insulation, wherein a first connecting layer is applied preferably between the electrical insulation and each of the first and/or second elements of the conductor profile. Since this first connecting layer is embodied in an electrically conductive fashion, electrical energy in the form of a current can be conducted out of the thermoelectric heat exchanger or conducted into said thermoelectric heat exchanger. The electrical insulation serves to avoid short-circuits and electrical bypasses, with the result that the pipes can also be manufactured from metallic material.

In one variant, a barrier layer is applied to the thermoelectric material, wherein the barrier layer and each element of the first and/or second part of the conductor profile are preferably connected to one another via a second connecting layer. The barrier layers prevent chemical elements from diffusing out of the thermoelectric material units here.

In one embodiment, the first and/or second pipes have at least one electrical connection which is placed in contact with the electrically conductive first connecting layer of the faces of the second and of the first pipe which support the first and/or second parts of the conductor profile. These electrical connections can be provided both on the first and on the second pipe, which pipes have corresponding openings for this purpose, with the result that said pipes can communicate with the thermoelectric material unit via electrical lines.

Alternatively, there may be electrical conductor strands which are connected to the thermoelectric material units via the electrically conductive first connecting layer, the conductor profile and the electrically conductive second connecting layer and lead to the electrical connections of the first or of the second pipe.

Another embodiment shows that the first and second pipes are interrupted by at least a predefined distance by a preferably thermomechanical, decoupling element. The decoupling element has the function of compensating thermal expansion differences between a cold side and a hot side of the heat exchanger and/or of absorbing stresses which occur. This has the effect that the first and the second pipe or pipe sections thereof can be adapted to one another in terms of their position, which prevents stresses occurring in the thermomechanically sensitive regions of the thermoelectric layer, such as the thermoelectric material, the insulation layer, the conductor profile or the connecting line.

In addition, the decoupling elements are connected upstream and/or downstream of the pipes. The decoupling elements can be embodied here as springs or as bellows.

Further advantageous embodiments are described by the following description of the figures and by the dependent claims.

BRIEF DESCRIPTION OF THE DRAWINGS

The invention will be explained in more detail below on the basis of at least one exemplary embodiment and with reference to the drawings, in which.

PREFERRED EMBODIMENT OF THE INVENTION

Figure 1:
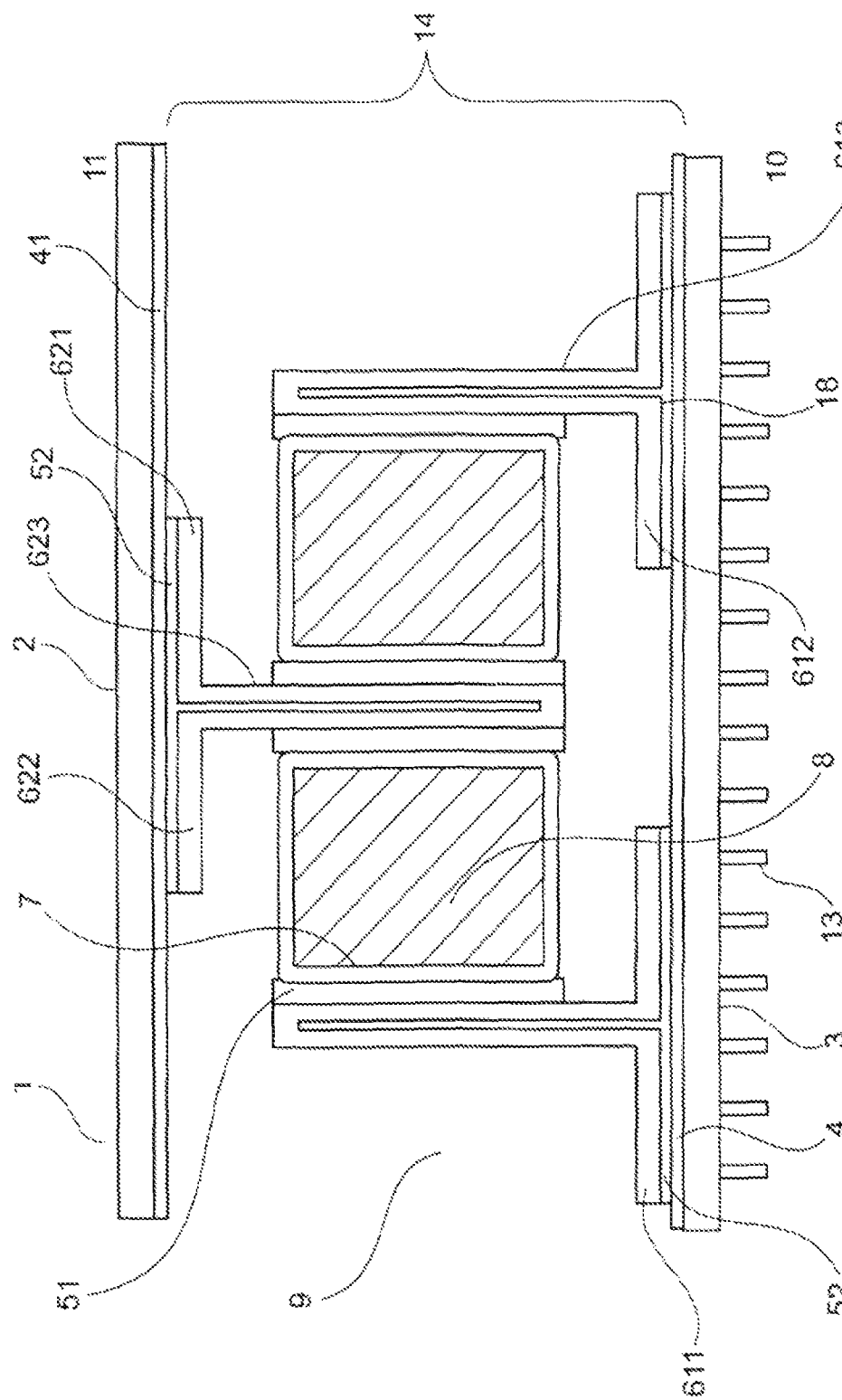
FIG. 1 is a schematic illustration of a detail of the first exemplary embodiment of a thermoelectric heat exchanger according to the invention.
Figure 2:
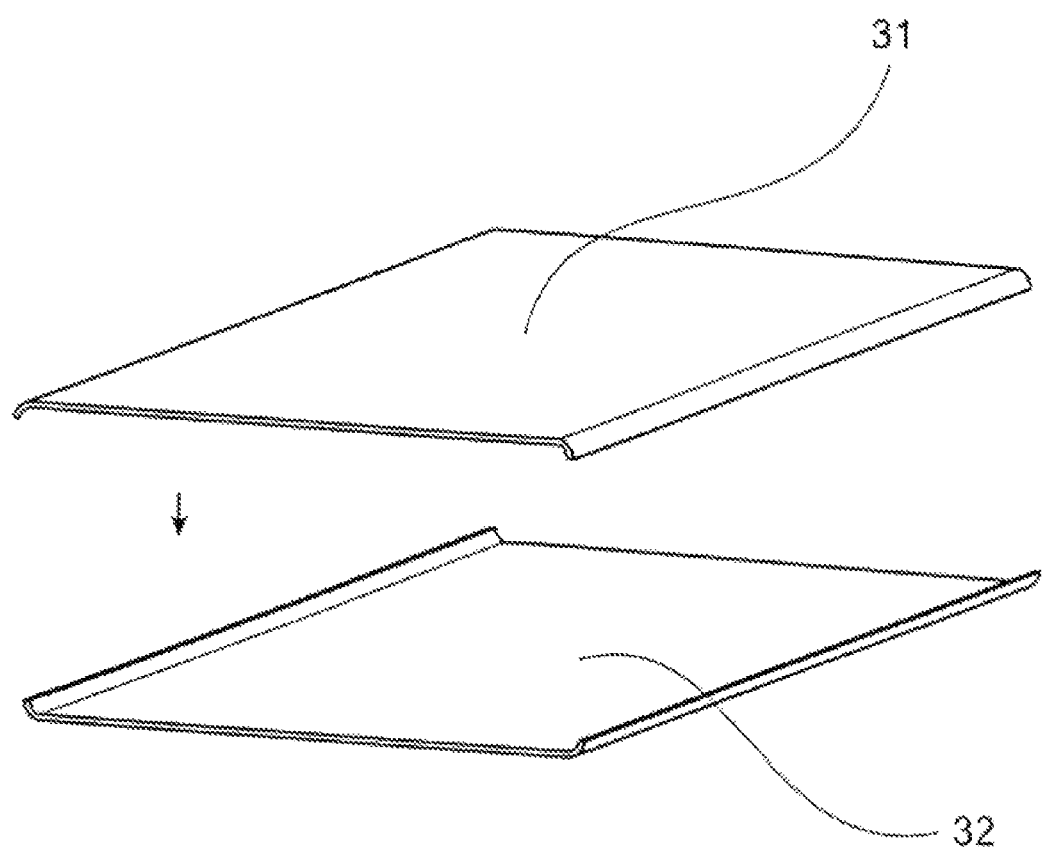
FIG. 2 is a first step for assembling the thermoelectric exchanger according to FIG. 1.

FIG. 1 shows a first embodiment of a thermoelectric heat exchanger 1 according to the invention which is embodied as a double pipe. The double pipe comprises here two pipes 2, 3 which each have a rectangular cross section and are also referred to as flat pipes, wherein the first pipe 2 completely surrounds the second pipe 3. Between the first pipe 2 located on the outside and the second pipe 3 located on the inside there is a pipe gap 14 which is filled with one or more thermoelectric devices 20. This thermoelectric device 20 comprises a thermoelectric material unit 8 which is not placed directly in contact with the pipes 2, 3 by virtue of a specially shaped conductor profile 6 in combination with expansion joints 18.

The pipes 2, 3 are fabricated from two half-pipes 21, 22; 31, 32, which are connected to one another, preferably soldered, at the contact points. A first fluid 10 is conduced inside the inner second pipe 3, while a second fluid 11 flows around the outside of the first pipe 2. The second pipe 3 has here fins 13 which point into its interior, in order to enlarge the surface of the second pipe 3 for the exchange of heat with the fluid 10.

The pipes 2, 3 can be manufactured from different materials. It is therefore possible, for example, to use ceramic in the form of aluminum oxide, aluminum nitrite, silicon nitrite or magnesium oxide. The use of a metal, such as a ferritic and austenitic stainless steel, nickel, a nickel based alloy, an iron-nickel alloy (Invar), an iron-nickel-cobalt alloy (Kovar), titanium, a titanium alloy, molybdenum, tantalum, chrome or tungsten, are equally possible.

In order to avoid short circuits or electrical shunts, the metallic pipes 2, 3 are provided with electrical insulation on each of the faces directed toward one another, which insulation is embodied as a ceramic or glass-like coating.

In this context, the first pipe 2 has the electrical insulation 41 on the inside, while the electrical insulation 42 is applied to the outside of the second pipe 3. For the purposes connecting the pipes 2, 3 externally and internally to, for example, the conductor profile 6 of the fins 13, these pipes 2, 3 can be correspondingly metalized or coated.

The thermoelectric material unit 8 is surrounded completely by a barrier layer 7, which is embodied, for example, on the basis of Ni, Co, Cr, Ti, Wo or Ta. The application can be carried out in different ways and can be carried out galvanically, in a currentless fashion, by thermal coating, by sputtering, hot pressing or pressure sintering.

The conductor profile 6 is embodied in two parts and has two parts 61, 62. In this context, the two parts 61, 62 of the conductor profile 6 project into one another with the free ends of the first elements 611 of the first part 61 and the free ends of the second elements 621 of the second part 62, wherein the thermoelectric material unit 8 is attached between the free ends of, in each case, a first element 611 of the first part 61 of the conductor profile 6 and, in each case, a second element 621 of the second part 62 of the conductor profile 6 and is supported by the first element 611 and the second element 621. The elements 611, 621 are embodied approximately similarly to a T. The barrier layer 7 of the thermoelectric material unit 8 is permanently connected here, via a first connecting layer 51, to the respective free end of the first element 611 of the first part 61 of the conductor profile 6, and of the free end of the second element 621 of the second part 62 of the conductor profile 6.

In particular, if the elements 611, 621 of the first and second parts 61, 62 of the conductor profile 6 are embodied similarly to a T, an expansion joint 18 is formed inside the long limb 613, 623 which forms the free end of the respective elements 611, 621. The short limbs 612, 622 of the respective T-like element 611, 621 are attached in parallel either on the inside of the first pipe 2 or on the outside of the second pipe 3. In this context, a second connecting layer 52 is applied to the electrical insulation 41, 42 of the respective pipe 2, 3, the short limbs 612, 622 of the T-like elements 611, 621 bearing on said second connecting layer 52 and being permanently connected thereto. Owing to this arrangement, the thermoelectric material unit 8 is attached in the pipe gap 14 between the pipes 2 and 3 in such a way that the thermoelectric material unit 8 is not in contact with the pipes 2, 3.

The pipe gap 14 between the pipes 2, 3 is filled with a thermally insulating filler material 9, which may be, for example, a gas such as nitrogen or argon, but also a solid such as ceramic mats, mineral wool, foam, glass, silicon oxide or plastic. Likewise, it is, however, also possible to use a gel or pastes as the filler materials 9.

The connecting layers 51, 52 can be manufactured here with different materials and connecting techniques which have partially electrically conductive and partially electrically non-conductive properties. It is therefore possible for the conducting layer 51, 52 to be composed of an organic adhesive such as a silicone adhesive or an epoxy resin adhesive. Alternatively, an organic adhesive composed of a metal powder or ceramic powder with chemically interlinking or curing binders can be implemented. Laser beam welding or plasma WIG welding, soldering and applied methods such as active metal brazing, wide gap active soldering, reactive air brazing, gas soldering, diffusion brazing, hot pressing, sinter pressing, direct copper bonding are also conceivable. Solders, solder pastes, solder foils and connecting materials such as SnAg—, ZnAl—, CuAl—, CuAg—, CuP—, CuZn—, CuNi—, Ag—, AgCu—, Au— or Ni-based materials, which have melting points between 600° C. and 1200° C. depending on the composition, are used for this. For the purpose of connection it may be necessary for the connecting faces of the parties in the joint to be cleaned, activated, metalized, or coated in advance. In a further variant, liquid-metallic materials such as Ga-based, In-based, Zn-based or Bi-based materials are capable of being used for thermal and/or thermal and electrical contact formation.

In the following FIGS. 2-7, the manufacture of the thermoelectric heat exchanger 1 according to FIG. 1 is explained in more detail. According to FIG. 2, the second pipe 3 is composed of two half shells 31 and 32 and joined at the connecting faces. In each case, a conductor profile 6 is fitted onto the second pipe 3, formed as a flat pipe, on each side, wherein the conductor profile 6 is composed of two parts 61, 62 which engage one in the other. Each part 61, 62 of the conductor profile 6 is composed of a multiplicity of individual elements 611, 621.

Figure 3:
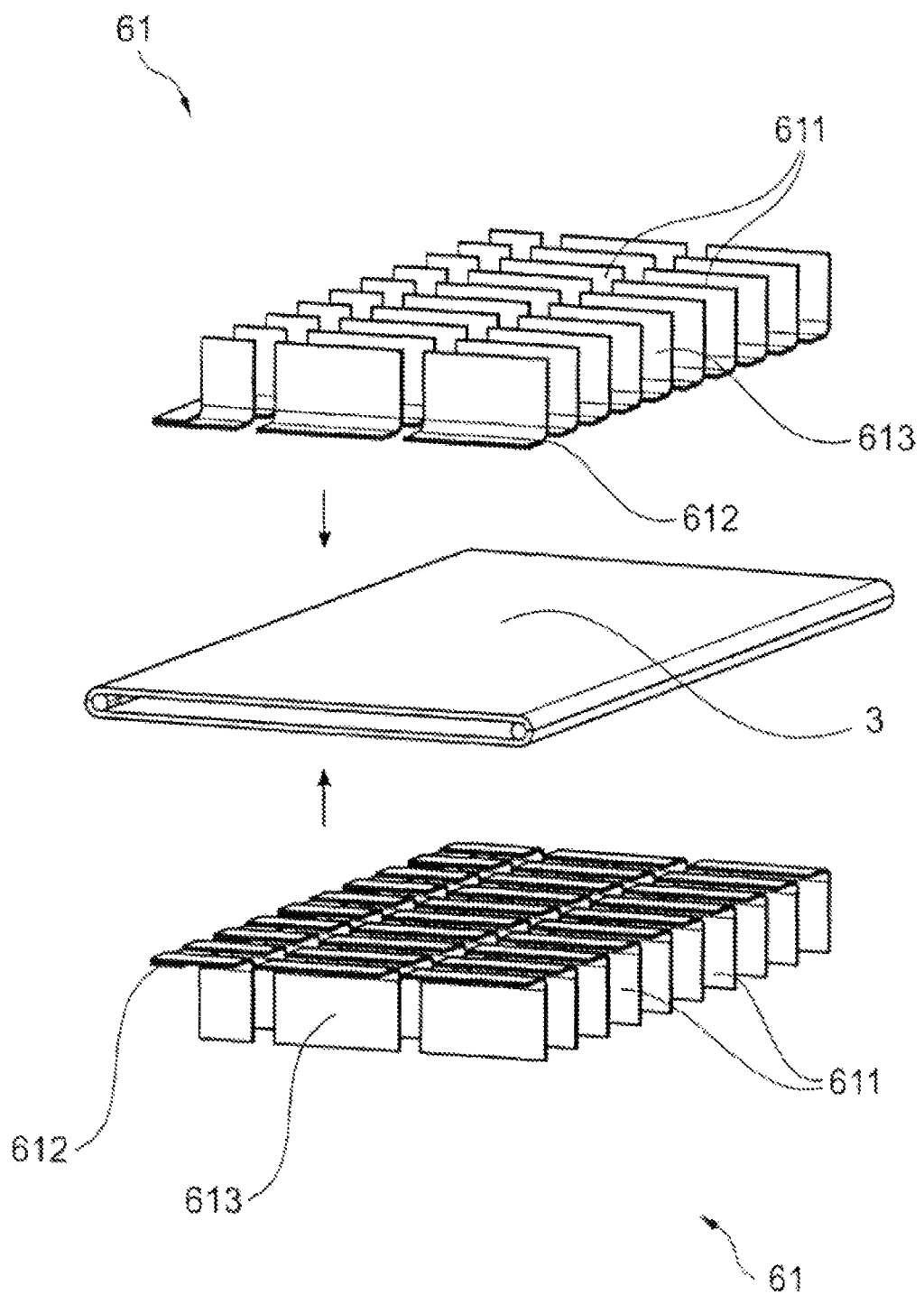
FIG. 3 shows a second step of the assembly of the thermoelectric heat exchanger according to FIG. 1.

The elements 611, illustrated in FIG. 3, of the first part 61, of the conductor profile 6 are configured in an L shape for the sake of clarity, wherein the elements 611 are arranged in a grid-like fashion behind one another and next to one another in a plurality of rows. The elements 611 of the first part 61 of the conductor profile 6 here have short limbs 612 which are oriented parallel to the surface of the second pipe 3. The long limbs 611 are oriented approximately perpendicularly to the surface of the second pipe 3.

Figure 4:
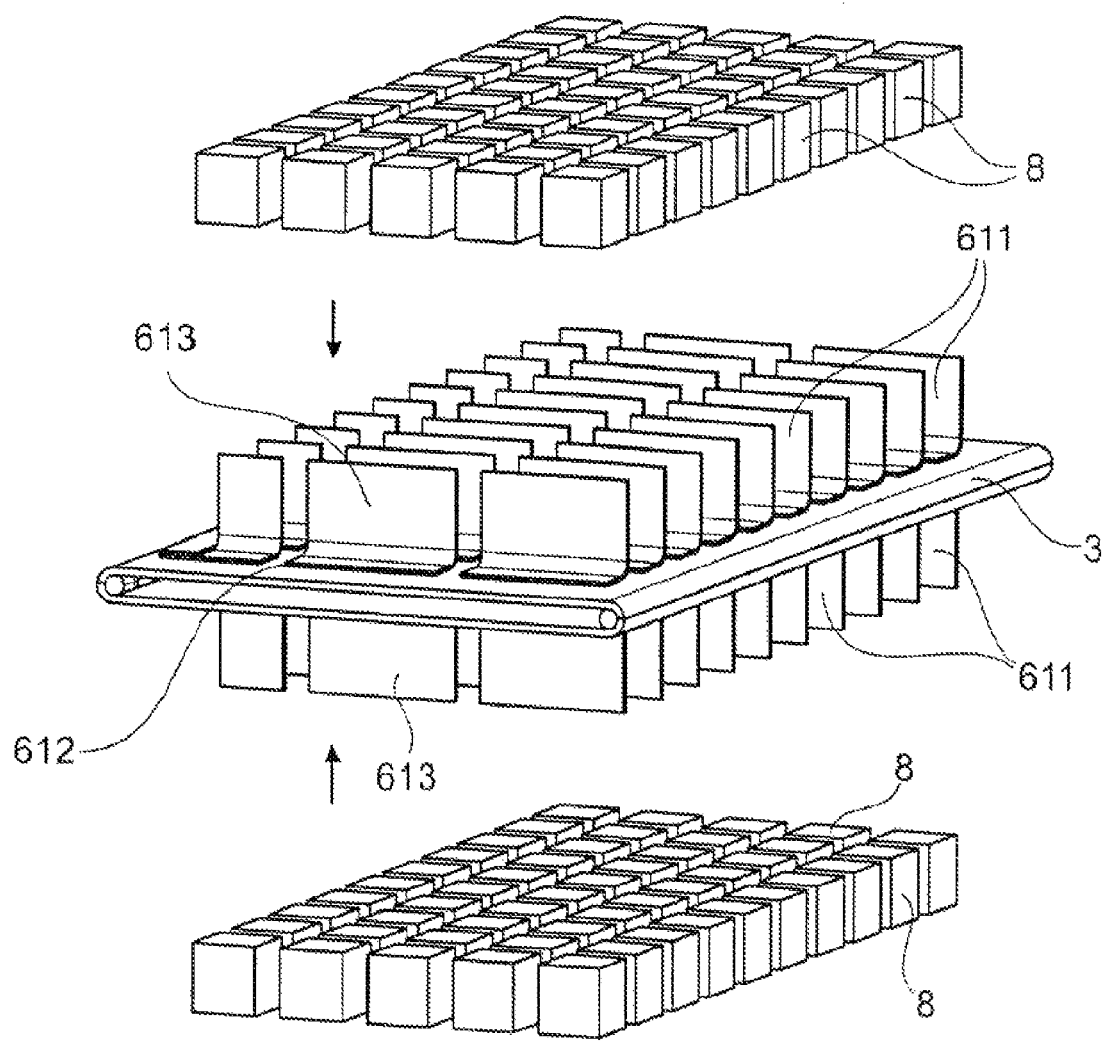
FIG. 4 shows a third step of the assembly of the thermoelectric heat exchanger according to FIG. 1.

After the short limbs 612 of the first part 61 of the conductor profile 6 have been fitted on both sides onto the second pipe 3, as illustrated in FIG. 3, according to FIG. 4 the thermoelectric material units 8 which are embodied in the form of a right parallelepiped are each introduced into the intermediate spaces between the long limbs 613 of the first element 611 of the first part 61 of the conductor profile 6. These thermoelectric material units 8 are attached, in the way described in conjunction with FIG. 1, to the long limbs 613 of the individual first elements 611 of the first part 61 of the conductor profile 6, with the result that no direct contact is produced between the thermoelectric material unit 8 and the second pipe 3.

Figure 5:
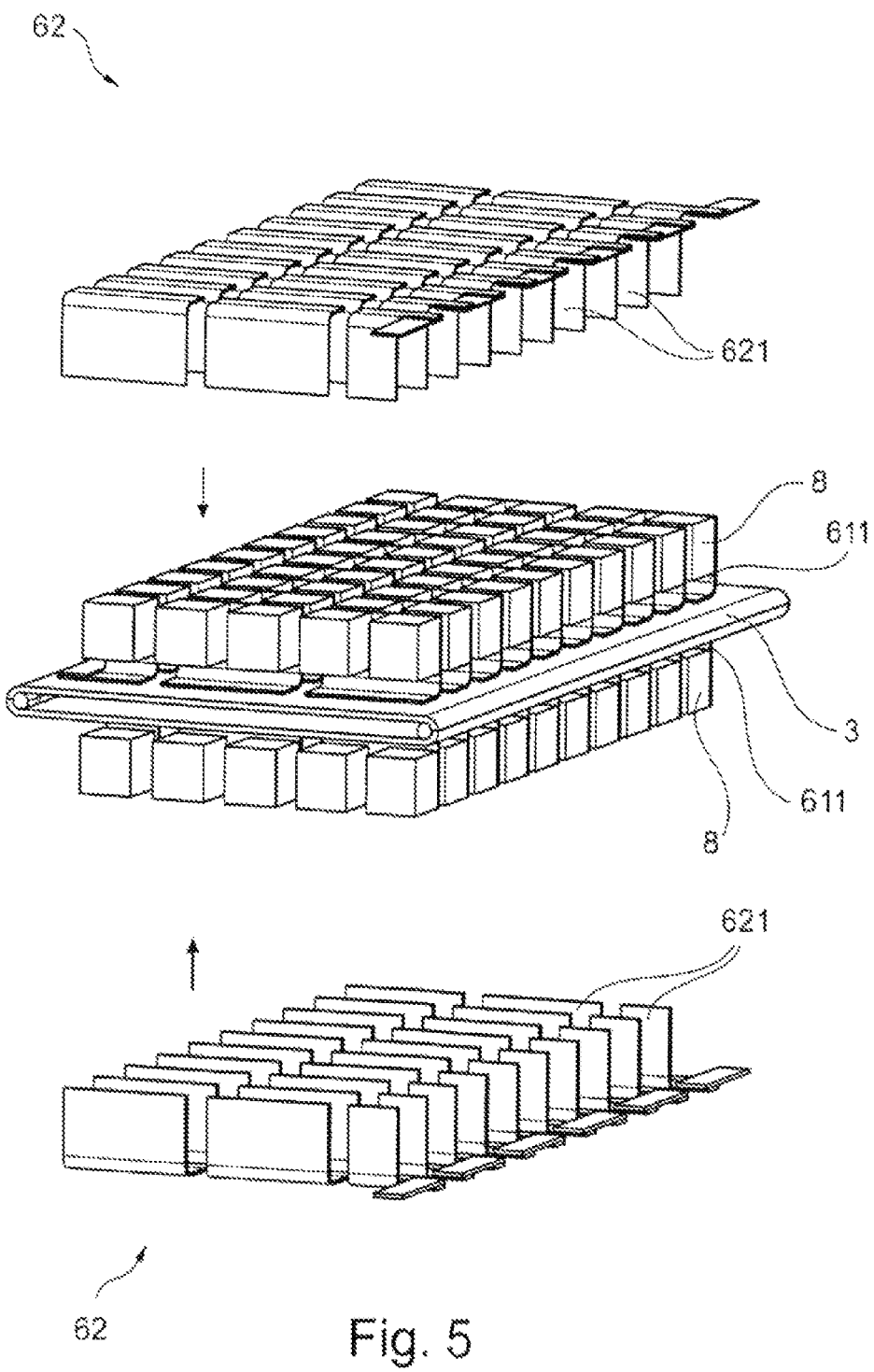
FIG. 5 shows a fourth step of the assembly of the thermoelectric heat exchanger according to FIG. 1.

According to FIG. 5, the second part 62 of the conductor profile 6 is subsequently positioned over the first part 61 of the conductor profile 6 which supports the thermoelectric material units 8. The second elements 621 of the second part 62 of the conductor profile 6 are formed in a way analogous to the first elements 611 of the first part 61 of the conductor profile 6, wherein each second element 621 also has a short limb 622 and a long limb 623. In this context, the short limbs 622 of the second elements 621 of the second part 62 of the conductor profile 6 are arranged parallel to the first pipe 2 and attached thereto, while the long limb 623 of the respective second element 621 of the second part 61 of the conductor profile 6 is in contact with a free region of the thermoelectric material unit 8. The thermoelectric material unit 8 is therefore attached on two sides to the conductor profile 6.

The thermoelectric material unit 8 is selected, for example, from the material groups of the skutterudites, half-Heuslers or silicides. Specific thermoelectric materials may be, for example, $CoSb_3$, $Bi_2Te_3$, PbTe or magnesium/manganese silicide. The thermoelectric material units 8 can be manufactured, inter alia, by means of a pressure sintering process, but alternatively also spark plasma sintering, in a powder-metallurgical fashion or by means of various crystal growing methods and zone melting processes.

Figure 6:
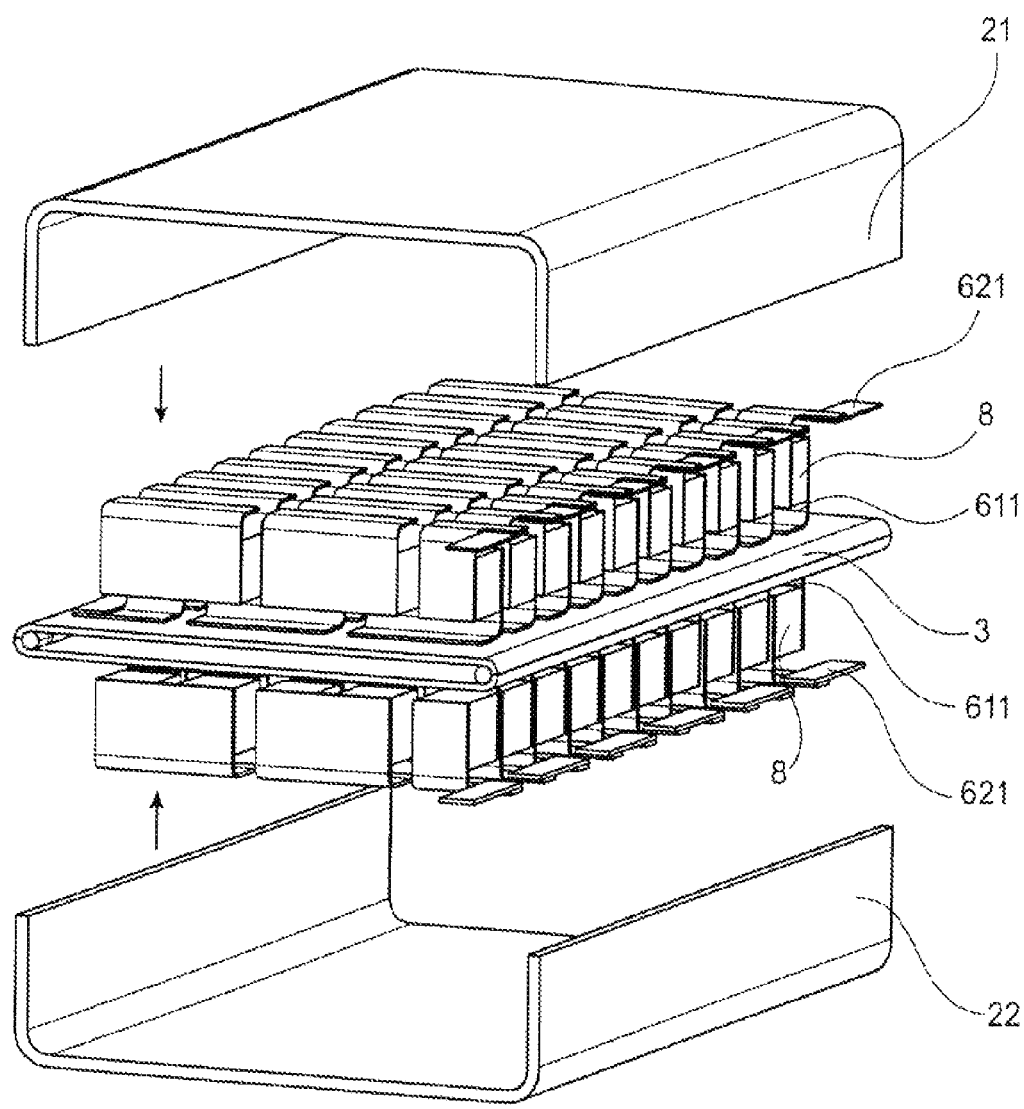
FIG. 6 shows a fifth step of the assembly of the thermoelectric heat exchanger according to FIG. 1.

After the mounting of the conductor profile 6, according to FIG. 6, the two halves 21, 22 of the second pipe 2 are guided by means of the conductor profile 6 and closed off, with the result that the first pipe 2 completely encloses the conductor profile 6, the thermoelectric material units 8 and second pipe 3. In this context, the respective short limb 612, 622 of the elements 611, 621 of the first and second parts 61, 62 of the conductor profile 6 makes contact with the second connecting layer 52 with which the pipes 2, 3 are provided.

Figure 7:
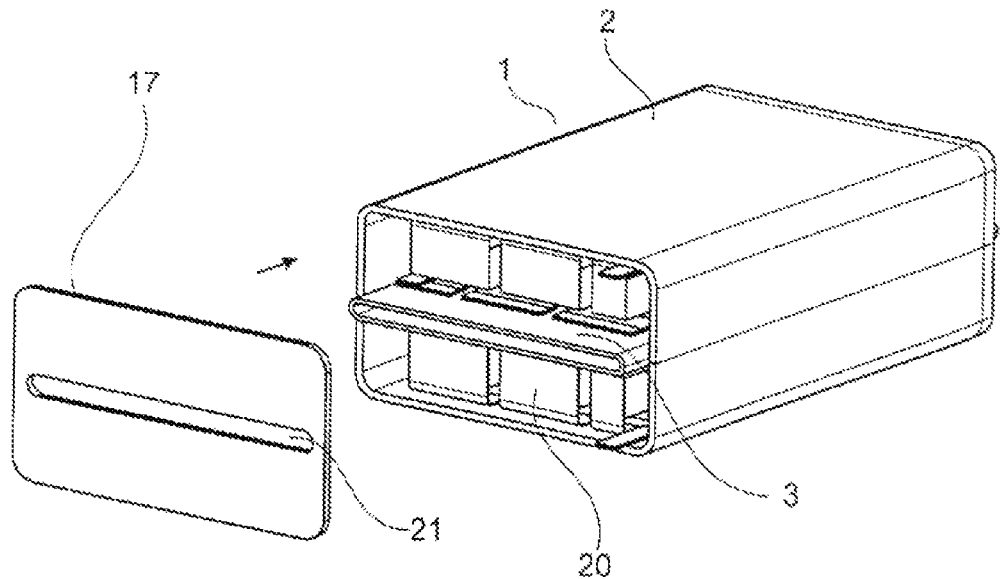
FIG. 7 shows a sixth step of the assembly of the thermoelectric heat exchanger according to FIG. 1.

FIG. 7 illustrates a perspective view through the thermoelectric heat exchanger 1 which is constructed and assembled according to FIG. 1. The second pipe 3 is made somewhat longer here than the first pipe 2 and engages in an opening 21 in a vertical cover 17 which laterally closes off the first pipe 2 after the conclusion of the assembly process.

Figure 8:
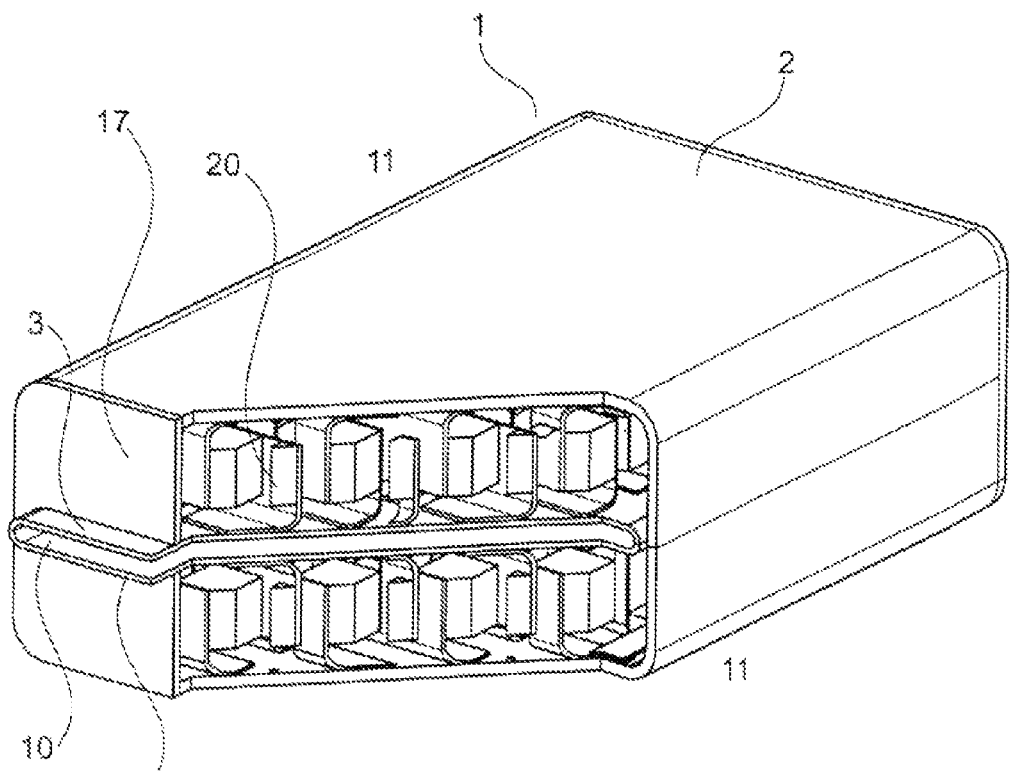
FIG. 8 shows a section through an assembled thermoelectric heat exchanger according to FIG. 1.

The completely assembled thermoelectric heat exchanger 1 is illustrated in FIG. 8, in which heat exchanger 1 the second, laterally open pipe 3 projects beyond the cover 17, as a result of which the second pipe 3 therefore has an outlet opening 15 and inlet opening 16 for the second fluid 10. Such a thermoelectric heat exchanger 1, which is configured to be compact and robust, can be connected to the floors of a further heat exchanger.

Figure 9:
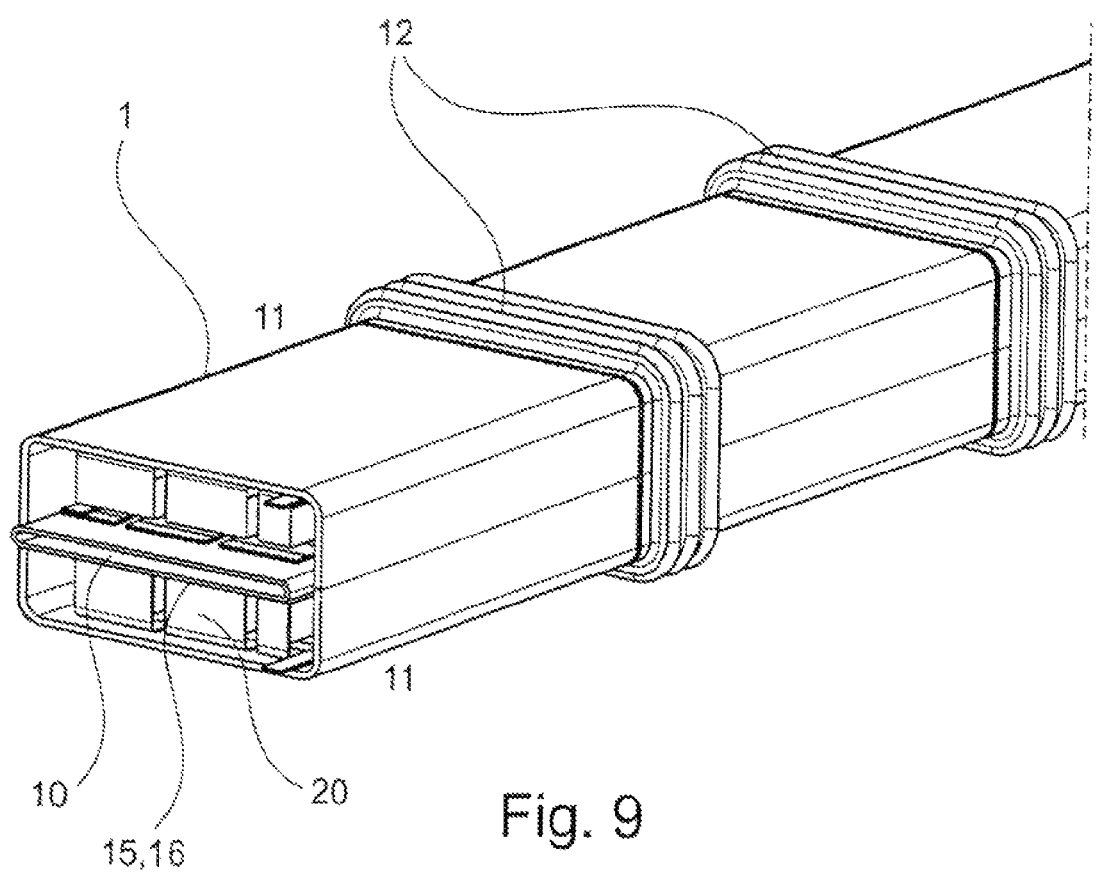
FIG. 9 shows a second exemplary embodiment of the heat exchanger according to the invention.

FIG. 9 shows a second exemplary embodiment of a thermoelectric heat exchanger 1 in which the pipes 2 and 3 are interrupted at regular intervals by decoupling elements 12. The decoupling elements 12 can be configured either as a bellows or also as a spring. Although it is not illustrated further, the coupling elements 12 can also be arranged upstream or downstream of the pipes 2, 3. The coupling elements 12 have the function of compensating differences in thermal expansion between the cold side (fluid 11, fluid 10) and the hot side (fluid 10, fluid 11) and stresses which occur.

Electrical connections (not illustrated further) of the thermoelectric heat exchanger 1 which has been explained can be provided either at the second pipe 3 or at the first pipe 2 and corresponding openings (not illustrated further) for this purpose, with the result that corresponding electrical conductor strands can communicate with the thermoelectric material units 8 via the first and second connecting layers 51, 52 and the conductor profile 6. When the electric conductor strands are attached to the first pipe 2, the second connecting layer 52 of the first pipe 2 and the second part 62 of the conductor profile 6 as well as the first connecting layer 51 which adjoins the conductor profile 6 are constructed so as to be electrically conductive and thermally conductive, while the second connecting layer 52 of the second pipe 3, which is connected to the first connecting layer 51 via the first part 61 of the conductor profile 6, is constructed so as to be only thermally conductive.

A further possibility is to make the electrical connection accessible via the pipe gap 14 at the respective axial ends of the pipes 2, 3, with the result that additional openings in the pipes 2, 3 are not necessary.

In the explained exemplary embodiments, the thermoelectric materials 8 which are used are connected to the conductor profile 6 after having been rotated through 90° with respect to the pipe faces 2, 3. Owing to the substantially L-like or T-like configuration of the elements 611, 621 of the first part 61 and of the second part 62 of the conductor profile 6, the latter are arranged orthogonally both with respect to the face of the pipes 2, 3 and with respect to the thermoelectric material units 8. This design relieves the loading on the elements 611, 621 of the first and second parts 61, 62 of the conductor profile 6 in the event of thermomechanical stress, and ensures that thermally induced expansion of the individual thermoelectric material units 8 cannot accumulate.

The conductor profile 6 is preferably a shaped piece of sheet metal or a metalized graphite film. The individual elements 611 and 621 of the conductor profile 6 and the thermoelectric material units 8 are connected to one another, with the result that, depending on the design and assignment, a continuous series circuit and/or parallel circuit is produced which is composed of the thermoelectric material units 8 and the conductor profile 6. The expansion joints 18 in the conductor profile 6 serve for thermomechanical decoupling.

Figure 10:
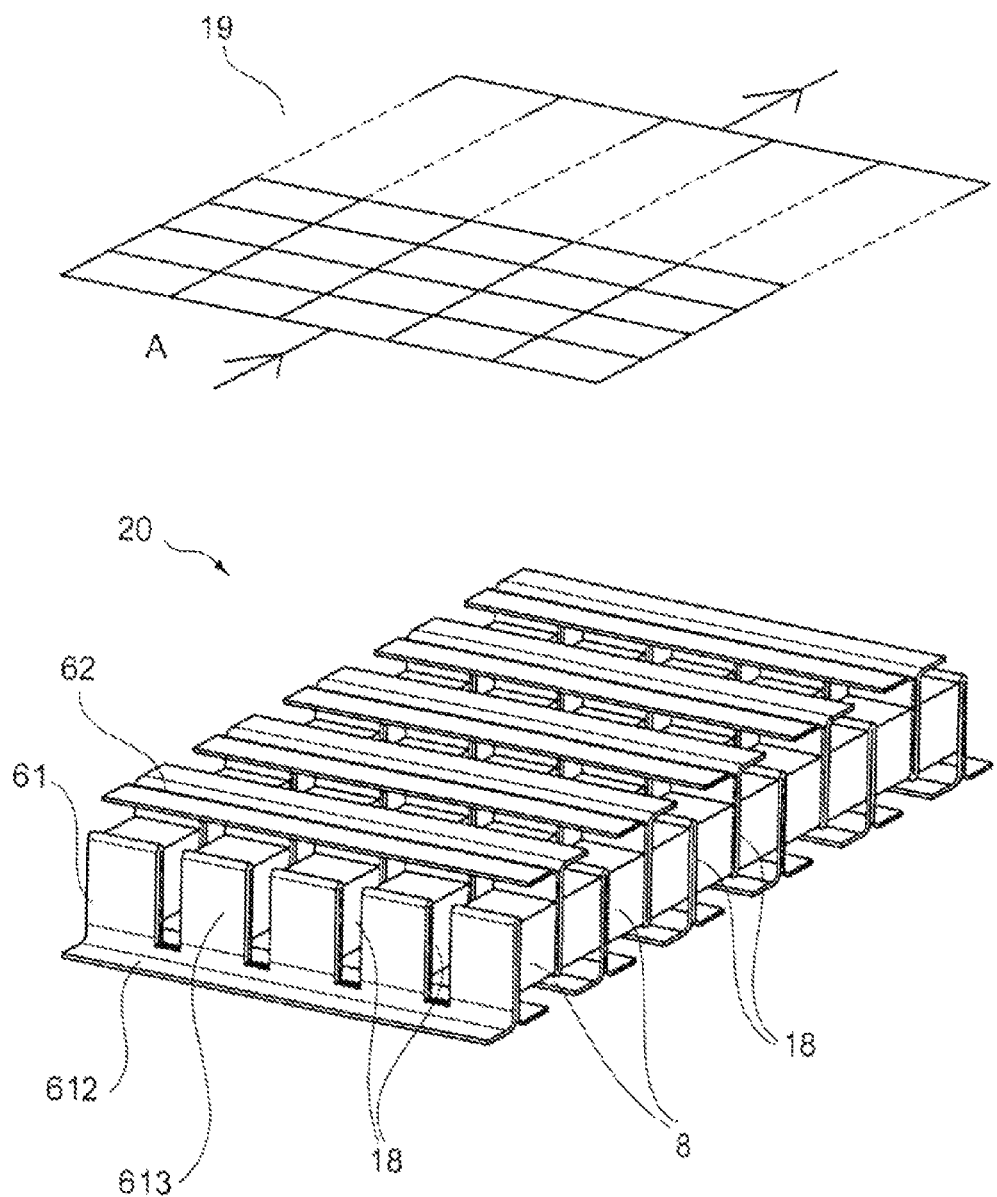
FIG. 10 shows a first exemplary embodiment of a thermoelectric device having an electric equivalent circuit diagram.

Various embodiments of the coupling of the thermoelectric material units 8 and of the conductor profile 6, referred to below as thermoelectric device 20, and of the associated current flow profiles are shown in the following FIGS. 10 to 12. FIG. 10 shows a first exemplary embodiment of the thermoelectric device 20 which is embodied as a parallel circuit and series circuit with expansion joints 18. The individual rows of the conductor profile 6 here have T-like elements 611, 621 which are punched out from a piece of sheet metal, wherein the individual T-like elements 611, 621 are connected to one another via their short limbs. If there is a flow through this thermoelectric device 20 in the direction of the arrow A, the electrical current is directed via all the thermoelectric material units 8, with the result that a grid-like current profile is produced, as is illustrated in the electric equivalent circuit diagram 19.

Figure 11:
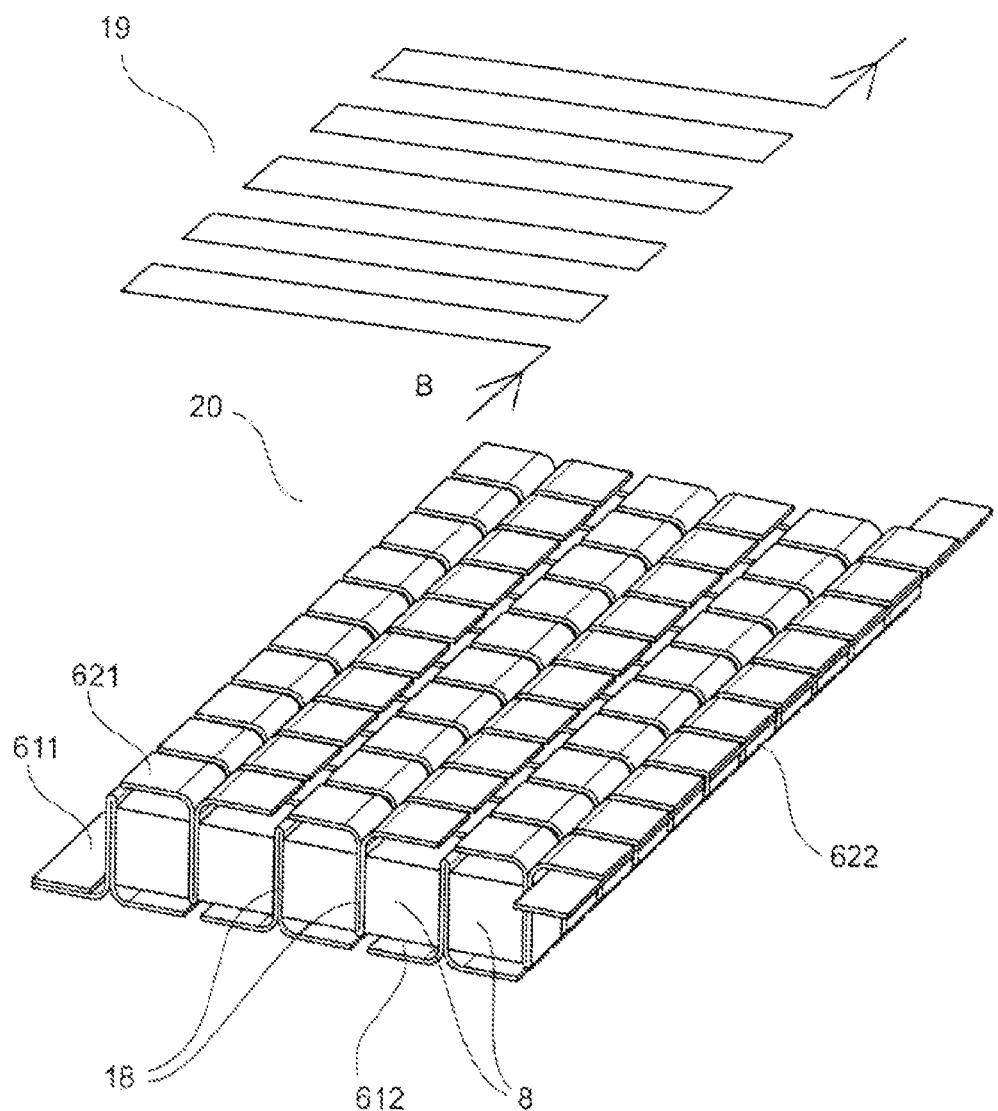
FIG. 11 shows a second exemplary embodiment of a thermoelectric device having an equivalent circuit diagram.

FIG. 11 illustrates a second exemplary embodiment of the thermoelectric device 20 composed of a conductor profile 6 and thermoelectric material units 8 as a series circuit with expansion joints 18. The expansion joints 18 are formed here within the long limbs 613, 623 of the T-like first and second elements 611, 621 of the first and second parts 61, 62 of the conductor profile 6. The rows which are formed by the individual elements 611, 621 of the conductor profile 6 are directed here into FIG. 11 in the vertical direction, while they are arranged in the horizontal direction in FIG. 10. In this series circuit in FIG. 11, the current is applied to a thermoelectric material unit 8, wherein the current profile runs in a meandering shape in the direction of the arrow B of the electric equivalent circuit diagram 19.

Figure 12:
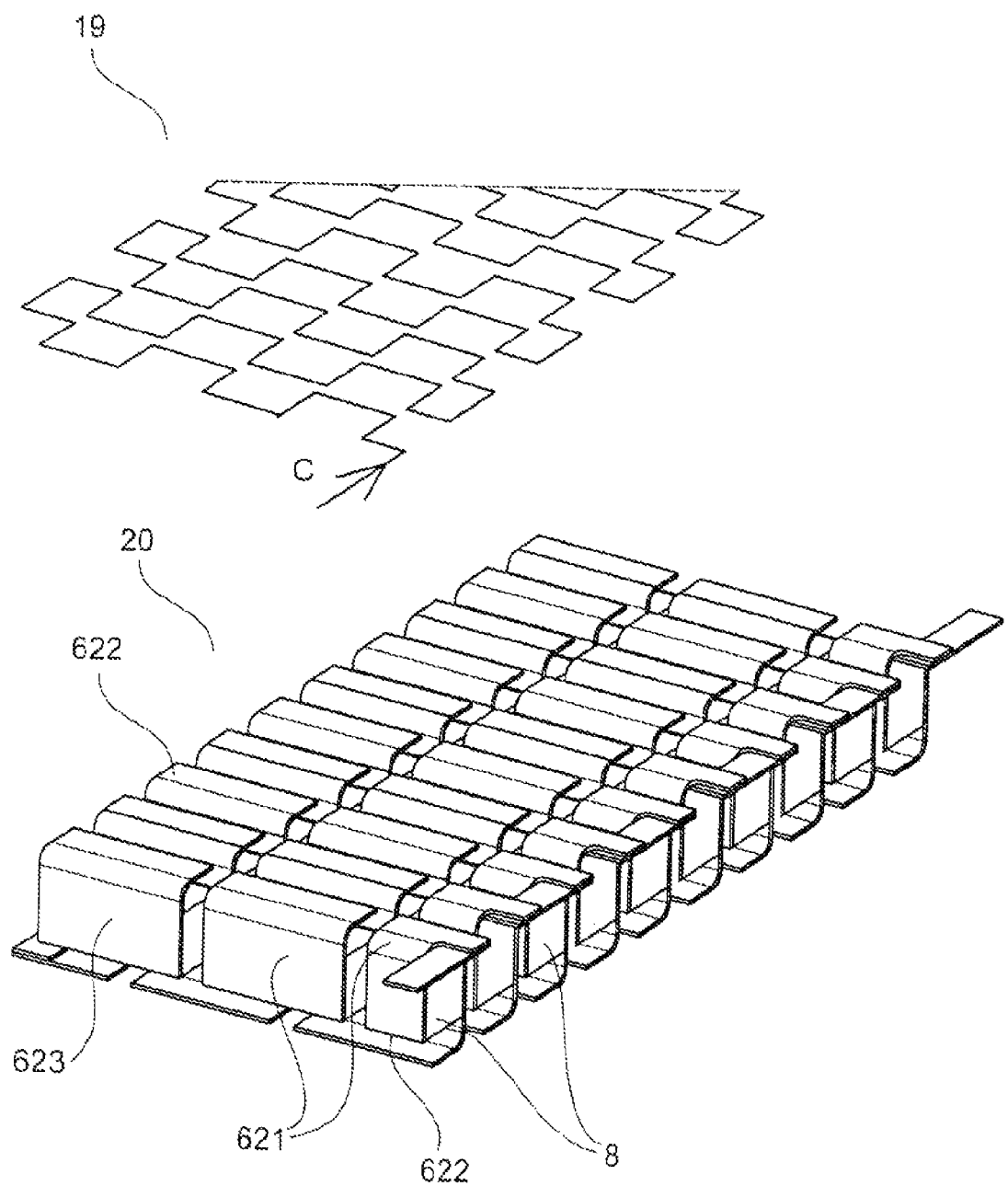
FIG. 12 shows a third exemplary embodiment of a thermoelectric device having an electric equivalent circuit diagram.
Figure 13:
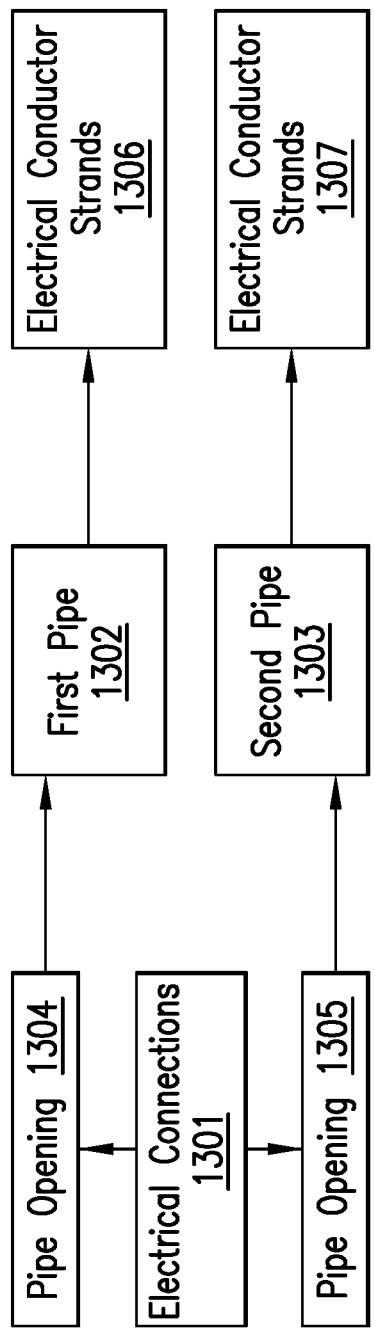
FIG. 13 shows a block diagram of an exemplary embodiment of the subject matter of this application. This block diagram includes electrical connections (1301), pipe openings (1304, 1305) of the first pipe (1302) and the second pipe (1303), as well as electrical conductor strands (1306, 1307). The block diagram of FIG. 2 shows connection only and is not intended to show structural features such as relative size, orientation, and spacing.

A further series circuit of the thermoelectric material units 8 and of the conductor profile 6 is illustrated in FIG. 12, in which circuit the long limbs 613, 623 of the first and second elements 611, 621 of the first and second parts 61, 62 of the conductor profile 6 form a series, wherein the current flowing through this arrangement likewise meanders in accordance with the direction of the arrow C in the equivalent circuit diagram 19.

The thermoelectric heat exchanger 1 which is explained can be used not only in a thermoelectric generator, as a result the latter replaces conventional thermoelectric materials, but in addition there is the possibility, in particular in hybrid vehicles or battery-operated electric vehicles, to replace conventional coolant-fed heaters for heating the passenger cell by this thermoelectric heat exchanger 1. This thermoelectric heat exchanger 1 acts here as an electrically fed heater which heats up the passenger compartment. With such a thermoelectric heater it is possible, in contrast to electrical resistance heaters, to implement COP values >1. The COP value is understood here to be a ratio of the heating power generated to the power used.

Given corresponding poling of the thermoelectric material units 8, the system can also be used to cool the cabin air in a vehicle. The proposed thermoelectric heat exchanger 1 is configured in such a way that it can be connected without problems into a tubular heat exchanger. The use as a heater eliminates a compressor at the heat pump so that it is possible to dispense completely with moving parts. In contrast to the thermoelectric generator, in the case of a thermoelectric heater or cooler there is a flow through the thermoelectric elements, as a result of which heat is conveyed from the first fluid into the other fluid. Heat losses are reduced by such a thermoelectric heat exchanger. Thermoelectrics can be suitably integrated into a heat transfer system.

The invention claimed is:

1. A thermoelectric heat exchanger, comprising two pipes, wherein a first pipe encloses a second pipe, further comprising a thermoelectric material unit which is arranged between the first and the second pipes, wherein a first fluid flows around the first pipe from the outside, while a second fluid flows through the second pipe, wherein the thermoelectric material unit is attached to a conductor profile which connects the first and the second pipes mechanically to one another via the thermoelectric material unit,
- wherein the conductor profile comprises two parts, wherein a first part of the conductor profile is attached to a second face of the second pipe, while a second part of the conductor profile is attached to a first face of the first pipe, wherein the first and the second parts of the conductor profile are connected to one another via the thermoelectric material unit,
- wherein a free end of the first part and a free end of the second part project towards one another and are each embodied in an L or T shaped configuration,
- wherein an electrical insulation is arranged between the first face of the first pipe and the second part of the conductor profile and between the second face of the second pipe and the first part of the conductor profile,
- wherein two first connecting layers are applied,
  - one between (i) the electrical insulation of the first face and (ii) the second part of the conductor profile and
  - one between (i) the electrical insulation on the second face and (ii) the first part of the conductor profile,
- wherein the at least one of the two first connecting layers is electrically conductive,
  - wherein the two first connecting layers each create a permanent connection,
    - one permanent connection between (i) the electrical insulation of the first face and (ii) the second part of the conductor profile and
    - one permanent connection between (i) the electrical insulation on the second face and (ii) the first part of the conductor profile,
- wherein the first pipe has at least one electrical connection placed in contact with its first connecting layer or the second pipe has at least one electrical connection placed in contact with its first connecting layer,
- wherein the first pipe and the second pipe are interrupted by at least a predefined distance by a thermomechanical decoupling element configured to allow the first pipe and the second pipe to adapt their relative positions to compensate for stress arising due to thermal expansion between a cold side and a hot side,
- wherein one of the two first connecting layers is not electrically conductive.

2. The thermoelectric heat exchanger according to claim 1, wherein the conductor profile is composed of a multiplicity of elements comprising first elements of the first part of the conductor profile and second elements of the second part of the conductor profile, wherein the first elements and the second elements are arranged in a pipe gap between the first and second pipes, wherein free ends of the first elements and free ends of the second elements project towards one another and are embodied in an L or T shaped configuration, wherein the first elements and second elements support the thermoelectric material unit.

3. The thermoelectric heat exchanger according to claim 2, wherein the pipe gap between the first and the second pipes is filled with a filler material.

4. The thermoelectric heat exchanger according to claim 2, wherein the first and second elements of the conductor profile have at least one expansion joint.

5. The thermoelectric heat exchanger according to claim 2, wherein a barrier layer is applied to the thermoelectric material unit, wherein the barrier layer and one of the first elements are connected via a second connecting layer, wherein the barrier layer and one of the second elements are also connected via the second connecting layer.

6. The thermoelectric heat exchanger according to claim 5, wherein electrical conductor strands are connected to at least one of the two first connecting layers so as to electrically communicate with the thermoelectric material unit via said one of the two first connecting layers, the first part or the second part, and one of the two second connecting layers, wherein the electrical conductor strands are connected to an electric connection of the first pipe or of the second pipe.

7. The thermoelectric heat exchanger according to claim 1, comprising a plurality of thermoelectric material units arranged in a parallel circuit and a series circuit.

8. The thermoelectric heat exchanger according to claim 1, comprising a plurality of thermoelectric material units arranged in a series circuit.

* * * * *